US005696729A

United States Patent [19]

Kitamura

[11] Patent Number: 5,696,729

[45] Date of Patent: Dec. 9, 1997

[54] POWER REDUCING CIRCUIT FOR SYNCHRONOUS SEMICONDUCTOR DEVICE

[75] Inventor: Mamoru Kitamura, Tokyo, Japan

[73] Assignee: NEC Corporation, Tokyo, Japan

[21] Appl. No.: 356,725

[22] Filed: Dec. 15, 1994

[30] Foreign Application Priority Data

Dec. 17, 1993 [JP] Japan .................................... 5-317676

[51] Int. Cl.[6] ...................................................... G11C 7/00

[52] U.S. Cl. ............................................ 365/227; 326/62

[58] Field of Search ................................ 326/39, 49, 62; 365/227, 229; 323/544

[56] References Cited

U.S. PATENT DOCUMENTS

| | | | |
|---|---|---|---|
| 4,686,386 | 8/1987 | Tadeo | 327/544 |
| 4,718,043 | 1/1988 | Akatsuka | 365/227 |
| 4,737,666 | 4/1988 | Umedo | 327/544 |
| 4,801,820 | 1/1989 | Nootbaar | 307/296 R |
| 4,963,769 | 10/1990 | Hiltpold et al. | 307/465 |
| 5,140,557 | 8/1992 | Yoshida | 365/227 |
| 5,251,178 | 10/1993 | Childers | 365/727 |
| 5,300,831 | 4/1994 | Pham | 327/544 |

FOREIGN PATENT DOCUMENTS

| | | |
|---|---|---|
| 0 337 172 | 10/1989 | European Pat. Off. . |
| 0 347 530 | 12/1989 | European Pat. Off. . |
| 0 471 542 A2 | 2/1992 | European Pat. Off. . |

*Primary Examiner*—Edward P. Westin
*Assistant Examiner*—Benjamin D. Driscoll
*Attorney, Agent, or Firm*—Sughrue,Mion,Zinn,Macpeak & Seas, PLLC

[57] ABSTRACT

A power conserving circuit configuration is presented which reduces the power supplied to the input/output pins in the initial input circuit in a synchronous semiconductor device. The circuit reduces the power to the input/output pins in the initial input circuit during the standby mode and/or readout mode, and restores the power to the initial input circuit, when an input signal is entered in an external disabling pin which generates an output disabling signal, which makes the output signal from the input/output pin to be nullified and causes the power to be restored in the synchronous semiconductor device.

2 Claims, 5 Drawing Sheets

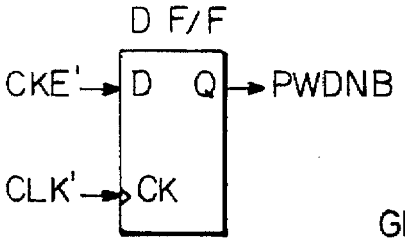
FIG.5a PRIOR ART
POWER-DOWN SIGNAL GENERATION CIRCUIT BASED ON D-FF
FIG.5b PRIOR ART
INITIAL INPUT CIRCUIT
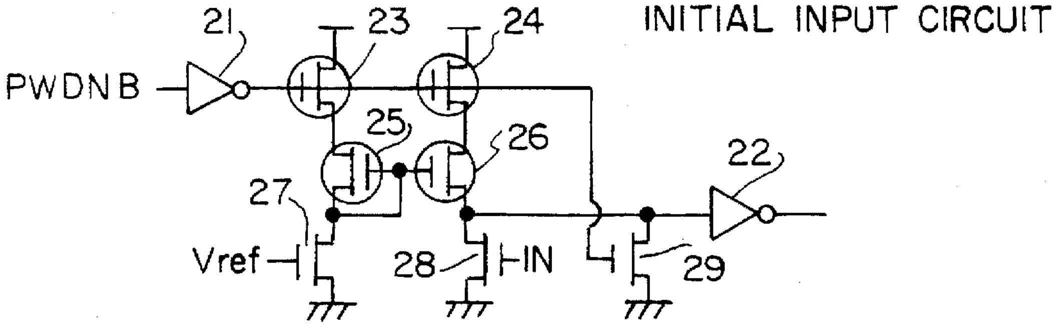
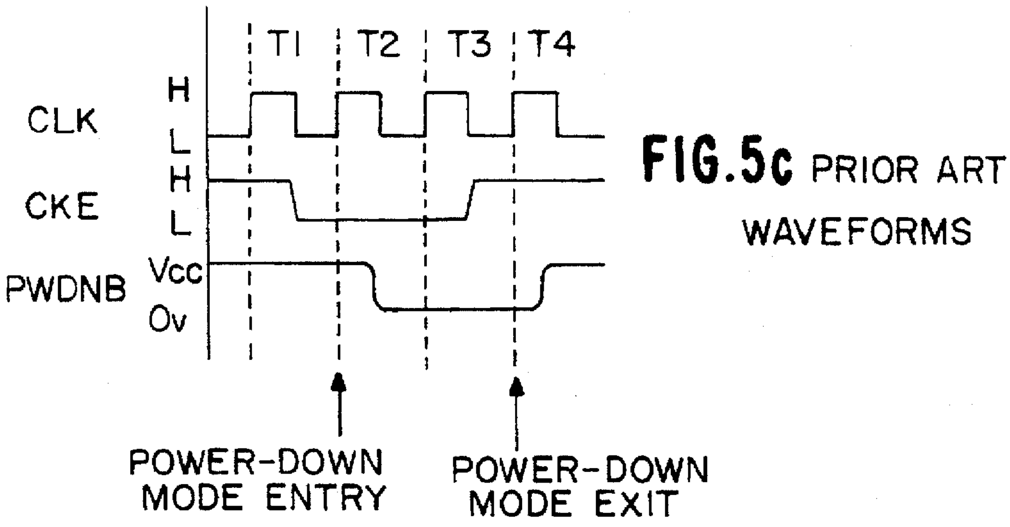
FIG.5c PRIOR ART
WAVEFORMS

POWER REDUCING CIRCUIT FOR SYNCHRONOUS SEMICONDUCTOR DEVICE

BACKGROUND OF THE INVENTION

1. Field of the Invention

The present invention relates in general to semiconductor devices, and relates in particular to a circuit configuration for reducing the power to the external input/output pin in a synchronous semiconductor device.

2. Description of the Prior Art

In DRAM devices, it is necessary to use current mirror circuit known to provide a rapid response in the initial input circuit so as to assure the setup and hold specifications of the input circuit. However, the current mirror circuit must be continually supplied with DC current. If one tries to speed up the response of the Dram by enlarging the transistor size, the current requirement also rises. Therefore, it is necessary to provide an operational mode for reducing the DC current, and in this category, there is known a circuit function for enabling to produce a reduction in power in accordance with a clock enable signal CKE.

A conventional power reducing circuit and the associated waveforms applicable to synchronous DRAM are shown in FIG. 5. In FIG. 5, a power-down signal generation circuit (i.e. power reducing circuit) using a D-type flip-flop (F/F) circuit is shown in section (a); an example of an initial input circuit in a synchronous DRAM device in section (b) and a signal waveform in the power-down circuit in section (c). CLK and CKE represent system clock signal and clock enable signal respectively, and CLK', CKE' represent common-mode signals of the input signal generated by system clock signal CLK, and CLOCK enable CKE signal respectively. PWDNB is a power-down mode signal supplied to the initial input circuit, and commands power-down when the circuit is low level. $V_{ref}$ is a standard potential produced in an internal circuit (not shown), and is usually a fixed potential between $V_{IH}$ and $V_{IL}$, the high and low values of the input circuit.

With reference to FIG. 5, the initial input circuit comprises: inverter circuits 21, 22; p-MOSFETs 23, 24, 25, and 26; n-MOSFETs 27, 28, and 29. The inverter circuit 21 is supplied with a power-down mode signal PWDNB, and the output signal from the inverter circuit 21 is supplied to the gate terminals of both p-MOSFETs 23, 24, and to the gate terminal of n-MOSFET 29. The source terminal of p-MOSFET 23 is connected to a voltage supply source, and its drain terminal is connected to the drain terminal of p-MOSFET 25. The source terminal of p-MOSFET 24 is connected to the supply potential, and its drain terminal is connected to the source terminal of p-MOSFET 26. The gate terminal of p-MOSFET 25 is connected to its own drain terminal and to the gate terminal of p-MOSFET 26. Therefore, p-MOSFETs 25, 26 constitute a current mirror circuit. The drain terminals of p-MOSFETs 25, 26 are respectively connected to the drain terminals of n-MOSPETs 27, 28. The gate terminals of n-MOSFETs 27, 28 are respectively supplied with the standard potential $V_{ref}$ and an external input signal IN, and the source terminals of n-MOSFETs 27, 28 are grounded. The drain terminal of p-MOSFET 26 is connected to the drain terminal of n-MOSFET 29, whose gate terminal is grounded. The drain terminal of p-MOSFET 26 is connected to the input terminal of inverter 22.

When the power-down mode signal PWDNB is at the high level and not commanding a power-down, the output signal from the inverter 21 is at the low level, therefore, p-MOSFETs 23, 24 are ON and n-MOSFET 29 is OFF. Therefore, the power from the power source is supplied to the current mirror circuit. If an external input signal IN higher than the standard potential $V_{ref}$ is inputted under this condition, the potential of n-MOSFET 28 becomes low, and a high level signal is outputted from the inverter 22. On the other hand, if an external signal IN of lower potential than the standard potential $V_{ref}$ is inputted, the potential of n-MOSFET 28 becomes high, and a low level signal is outputted from the inverter 22.

Conversely, when the power-down mode signal PWDNB is at the low level and commanding the power to be lowered, the output signal of the inverter 21 becomes high, making p-MOSFETs 23, 24 to be OFF, and n-MOSFET 29 to be ON. Therefore, the power is not supplied to the current mirror circuit from the power source, and the current does not flow in the current mirror circuit.

Next, the timing chart of the power-down signal generation circuit shown in section (a) in FIG. 5 will be explained with reference to the waveforms shown in section (c). With the booting up of the system clock signal CLK in cycle T2, the low level signal of the clock enable signal CKE is latched by the D-type flip-flop signal shown in section (a), and when the power-down mode signal PWDNB becomes a ground level (low level), the initial input circuit shown in section (b) goes into power-down mode, and the power to the circuit is reduced.

Also, with the booting up of the system clock signal CLK in cycle T4, the high level signal of the clock enable signal CKE is latched, and when the power-down mode signal PWDNB reaches the Vcc level (high level), the initial input circuit exits the power-down mode, and power to the circuit is turned on.

In the conventional power reducing circuit presented above, a problem existed that turning the power off to the current mirror circuit only when the synchronous semiconductor device is turned off was inadequate for power conservation, because the current was still flowing in the initial input circuit during all the operational steps the of the device. Ideally, the power should be reduced for all non-essential steps for maximizing power conservation.

SUMMARY OF THE INVENTION

Therefore, the objective of the present invention is to present a power reducing circuit configuration for reducing the power supplied to the initial input circuit in a synchronous semiconductor device so as to decrease the power consumption during the standby mode and/or the readout mode of the operation of the synchronous semiconductor device.

The above objective is achieved in power conservation circuit means for reducing the power supplied to an initial input circuit in a synchronous semiconductor device, having a plurality of memory banks, comprising a power reducing circuit means for reducing the power supplied to the initial input circuit by generating a power-down signal when the synchronous semiconductor device is in a standby mode and/or a readout mode during the operation of the synchronous semiconductor device.

Another aspect of the invention is that the power reducing circuit means is provided with external disabling means to nullify the power reduction in the initial input circuit when a disabling signal is inputted in the external disabling pin when a signal is inputted into the input/output pin during the readout mode of the operation of the synchronous semiconductor device.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 2 (*b*) is an initial input circuit for receiving the power reduction signal generated by the power reducing circuit; FIG. 2 (*c*) is the details of the power reducing circuit of the present invention;

FIG. 5 (*a*) is a conventional power reducing signal generation circuit; FIG. 5 (*b*) is the initial input circuit for receiving the power reduction signal generated by a conventional power reducing circuit; and FIG. 5(*c*) is the details of the conventional power reducing circuit.

PREFERRED EMBODIMENT

Figure 1:
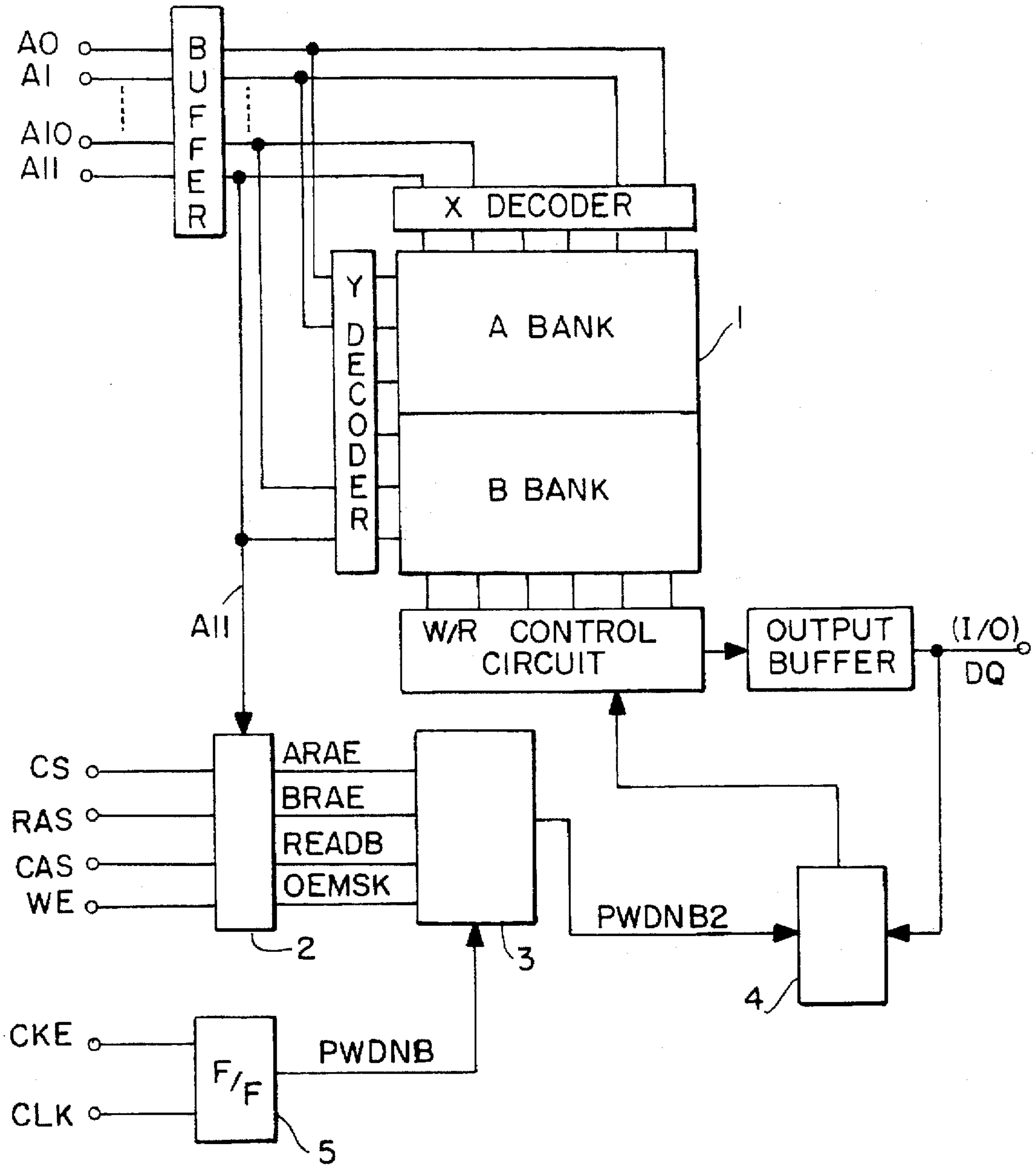
FIG. 1 is a circuit diagram of the semiconductor memory device showing a first embodiment of the invention.

A preferred embodiment will be explained with reference to FIG. 1.

When using general purpose DRAMs for information processing, a common device may be shared among several functions. In such a design, memory cell array 1 is arranged in a plurality of banks A and B to improve the operational efficiency of the circuit. A bank in this case refers to a memory configuration enabling parallel accessing.

A synchronous DRAM device which includes the power reducing circuit of the present invention comprises two banks specified by 0 to 11 address bits, A0 to A11, and the 11th address bit A11 is assigned to the task of selecting a bank. Therefore, the 11th address bit A11 is termed the bank selection input signal. A Y Decoder selects the A bank when the 11th address bit A11 is at the low level, that is when the bank selection input signal is low, and selects the B bank when the 11th address bit A11 is at the high level. In the following explanation, X- designates an inverted signal of X (shown in the drawings by placing - on top of X). It should be noted that if the bank selection signal A11 is used as an address memory, the entire synchronous DRAMs can be used as one bank.

The circuit configuration of the synchronous DRAM is provided with two sets of vertical address input systems of general purpose DRAM, in other words, two RAS (vertical address strobe) system circuits, and an independent activate command can be inputted in A and B banks.

The logic circuit for the power reducing circuit is disposed in the interior of the synchronous DRAM, and is supplied with control signals, such as the one shown in section (a) in FIG. 1, generated in a interior control circuit 2.

The interior control circuit 2 is supplied with CS (chip select signal), RAS, CAS and WE (Write enable signal), and according to these signals, generates ARAE, BRAE, READB and OEMSK.

The control signals shown in FIG. 1 are explained in the following. ARAE refers to a RAS system enable signal in the A bank, BRAE refers to a RAS system enable signal in the B bank, and is high level in the active state. READB refers to a read activate signal which operates after the read command is entered during the readout cycle, and becomes low level during a burst length of clock cycles. OEMSK refers to an output masking signal which disables an internal output enable signal during the readout operation, and makes the output signal to be high level by making the internal output signal to be high impedance by the use of disabling signal DMQ. OEMSK is high level during the readout operation.

PWDNB is a power-down mode signal for activating the power-down mode with the use of the clock enable signal CKE, and PWDNB 2 is a power-down command signal for the initial input circuit, and is at the low level during the power-down mode.

Figure 2A:
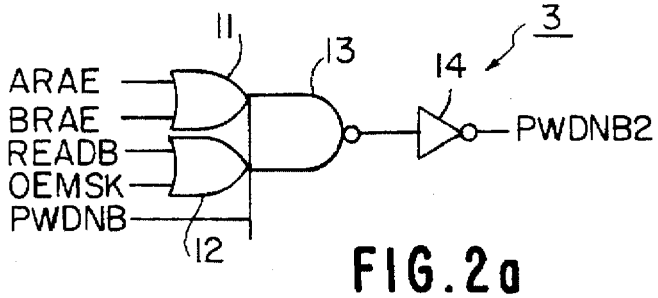
FIG. 2 (*a*) is a power reducing logic circuit of the present invention.
Figure 2B:
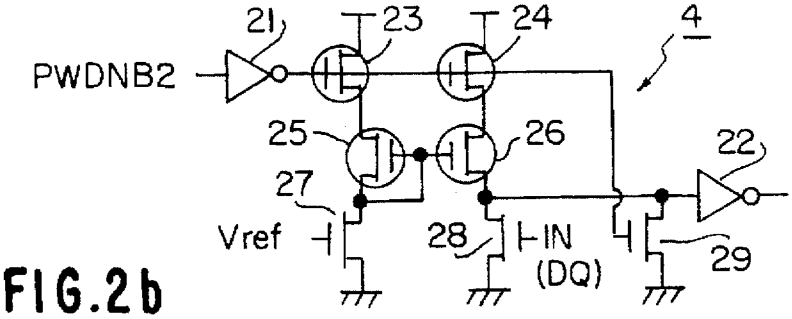
Figure 2C:
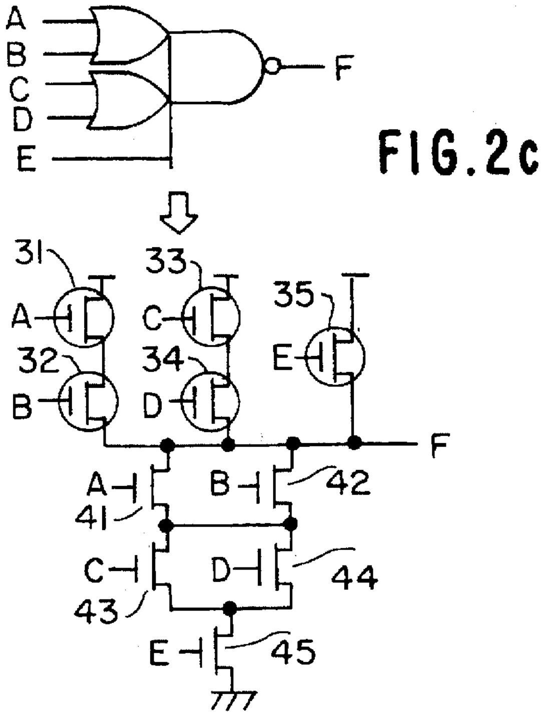

The power down signal generating circuit 3 shown in FIG. 2(*a*) comprises: a first OR circuit 11; a second OR circuit 12; NAND circuit 13; and an inverter circuit 14. The first OR circuit 11 is supplied with a RAS enable signal ARAE from the A bank, and a RAS enable signal BRAE from the B bank. The second OR circuit 12 is supplied with a read activate signal READB and output masking signal OEMSK. The NAND circuit 13 is supplied with the output signal from the first OR circuit 11, the output signal from the second OR circuit 12 and the power-down command signal PWDNB 2. The inverter circuit 14 inverts the output signal from the NAND circuit 13, and supplies the power-down command signal PWDNB2 to the initial input circuit 4 shown in FIG. 1 and FIG. 2(*b*).

The initial input circuit 4 has the same circuit configuration as that shown in FIG. 5(*b*). The only difference is in the signal which is inputted into the initial input circuit. Specifically, in the present invention, the power-down command signal PWDNB2 (from the power down signal generating circuit 3) is supplied to the initial input circuit 4 while in the conventional initial input circuit, the power-down mode signal PWDNB (from the power-down signal generation circuit 5 which has the same circuit configuration shown in FIG. 5) is supplied to the initial input circuit 4.

FIG. 2(*c*) shows a circuit configuration of circuit 3 constructed with a CMOS gate circuit in all the circuits excepting in the inverter circuit 14. The circuit 3 are supplied with input signals A, B, C, D and E, and outputs a signal F. The circuit 3 comprises five p-MOSFETs 31–35, and five n-MOSFETs 41–45. The gate terminals of the p-MOSFETs 31–35 are supplied with input signals A, B, C, D and E. The gate terminals of the n-MOSFETs 41–45 are also supplied with input signals A, B, C, D and E.

The supply power is connected to the source terminal of p-MOSFET 31, and the drain terminal of p-MOSFET 31 is connected to the source terminal of the p-MOSFET 32, and the drain terminal Of the p-MOSFET 32 is connected to the output terminal for outputting signal F. Similarly, the supply power is connected to the source terminal of p-MOSFET 33, and the drain terminal of p-MOSFET 33 is connected to the source terminal of p-MOSFET 34, and the drain terminal of p-MOSFET 34 is connected to the output terminal. The source terminal of p-MOSFET 35 is connected to the power source, and the drain terminal of p-MOSFET 35 is connected to the output terminal.

The drain terminals of n-MOSFETs 41, 42 are connected to the output terminal, and the source terminals of n-MOSFETs 41, 42 are connected in common, and are also connected in common to the drain terminal of n-MOSFETs 43, 44. The source terminals of n-MOSFETs 43, 44 are connected in common, and are also connected to the drain terminal of n-MOSFET 45. The source terminal of n-MOSFET 45 is grounded.

Figure 3:
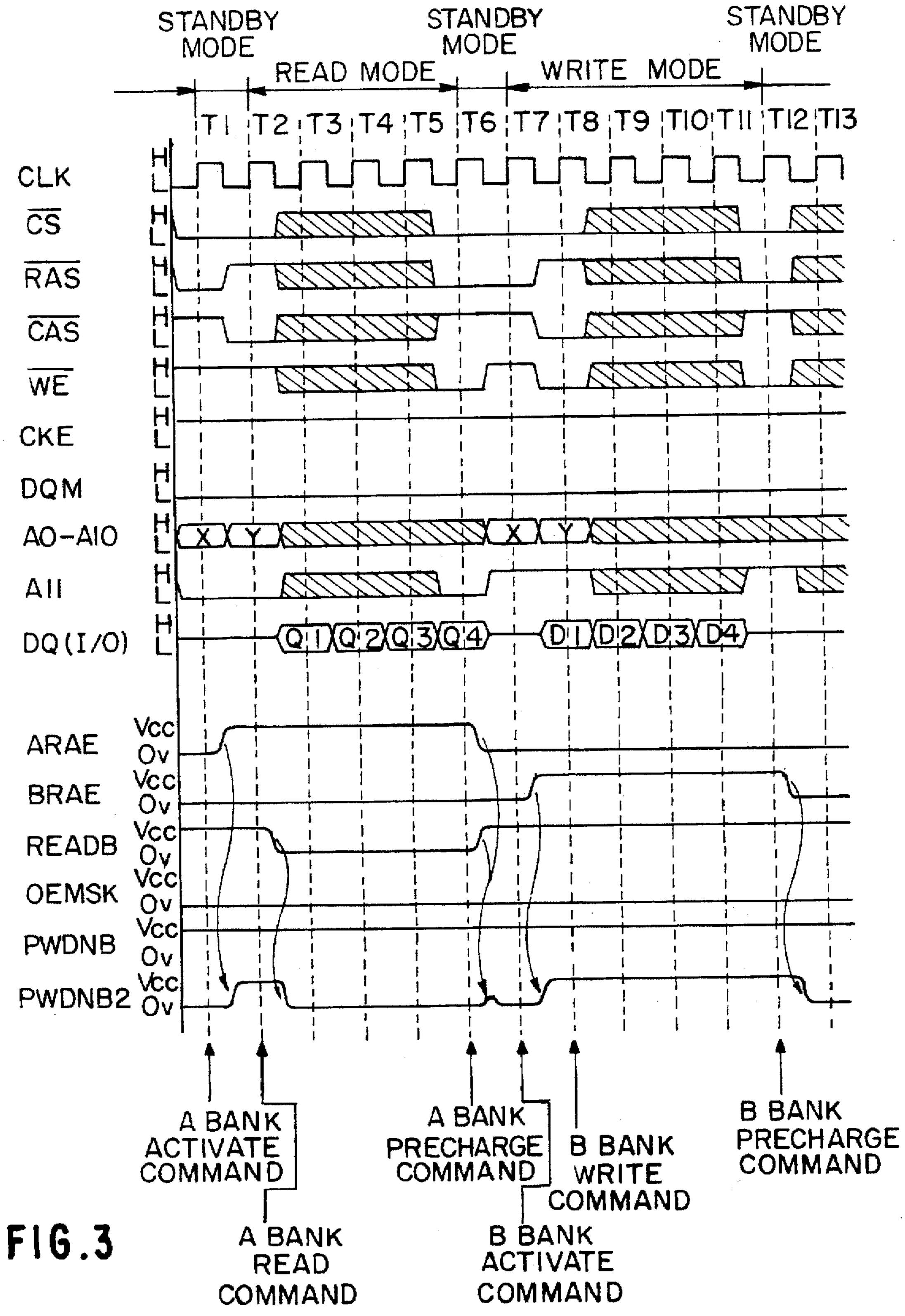
FIG. 3 is a timing chart for explaining the operation of the power reducing circuit shown in FIG. 2.

The operation of the power down signal generating circuit 3 will be explained with reference to FIGS. 3 and 4. In these figures, CLK refers to a system clock signal, CS is a chip select signal, $RAS^-$ is a vertical address strobe signal, $CAS^-$ is a horizontal address strobe signal, $WE^-$ is a write enable signal, CKE is a clock enable signal, DMQ is a disabling signal, A0–A10 are address signals, A11 is a bank selection signal, DQ is input/output data signal. The operating waveforms of this embodiment apply only to the case of CAS latency=1, and burst length=4 (Q1, Q2, Q3 and Q4).

The first operation utilizes both A and B banks, and four output data bits Q1, Q2, Q3 and Q4 for the readout step, and four input data bits D1, D2, D3 and D4 for the write step. In the first case, the CKE signal remains high throughout, and the DQM signal remains low throughout.

When A bank activate command is inputted in T1 cycle, A-bank RAS system enable signal ARAE becomes high level, as indicated by a rise in potential to Vcc. Next, in the T2 cycle, A-bank read command is inputted and read activate signal READB becomes low level, and because output enable masking signal OEMSK is at the low level, the power-down command signal PWDNB2 becomes low level subsequently, as indicated by the an event relating arrow. Accordingly, the power during the readout period in the initial input signal circuit 4 is reduced.

In the T6 cycle, A-bank precharge command is inputted, and the A-bank RAS system enable signal ARAE returns to low level.

In the T7 cycle, B-bank activate command is inputted, and the B-bank RAS system enable signal BRAE becomes high level. In the T8 cycle, B-bank write command is inputted, and in T12 cycle, when B-bank precharge command is inputted, A-bank RAS system enable signal ARAE and B-bank RAS system enable signal BRAE both become low level, and the power-down command signal PWDNB2 for the initial input circuit also becomes low level.

Accordingly, the power for the standby mode in the initial input signal circuit 4 is reduced.

Next, the second operation of the power reducing circuit will be explained with reference to FIG. 4. The CKE signal remains high as in the first operation. The use of the DQM signal will be illustrated in the second operation in terms of the A bank only, but the purpose is only to illustrate the general principle of the operation of the power reducing circuit. The second operation concers input data Q1, Q2, and Q3 for the read mode, and D1, D2, D3 and D4 for the write mode.

A-bank activate command is inputted in the T1 cycle, and likewise, A-bank read command, A-bank write command, A-bank precharge command are inputted, respectively, in T2, T7, and T11 cycles.

In T4 cycle, disabling signal DQM becomes high level, and the fourth output of the burst read is disabled, and becomes high impedance.

In synchronous DRAM, more than one cycle of high impedance period is required between a write step and a readout step. However, if the fourth output data bit Q4 of the burst read is not required, it is possible to input write command in T7 cycle by activating the data masking signal DQM by inputting a high level signal.

Figure 4:
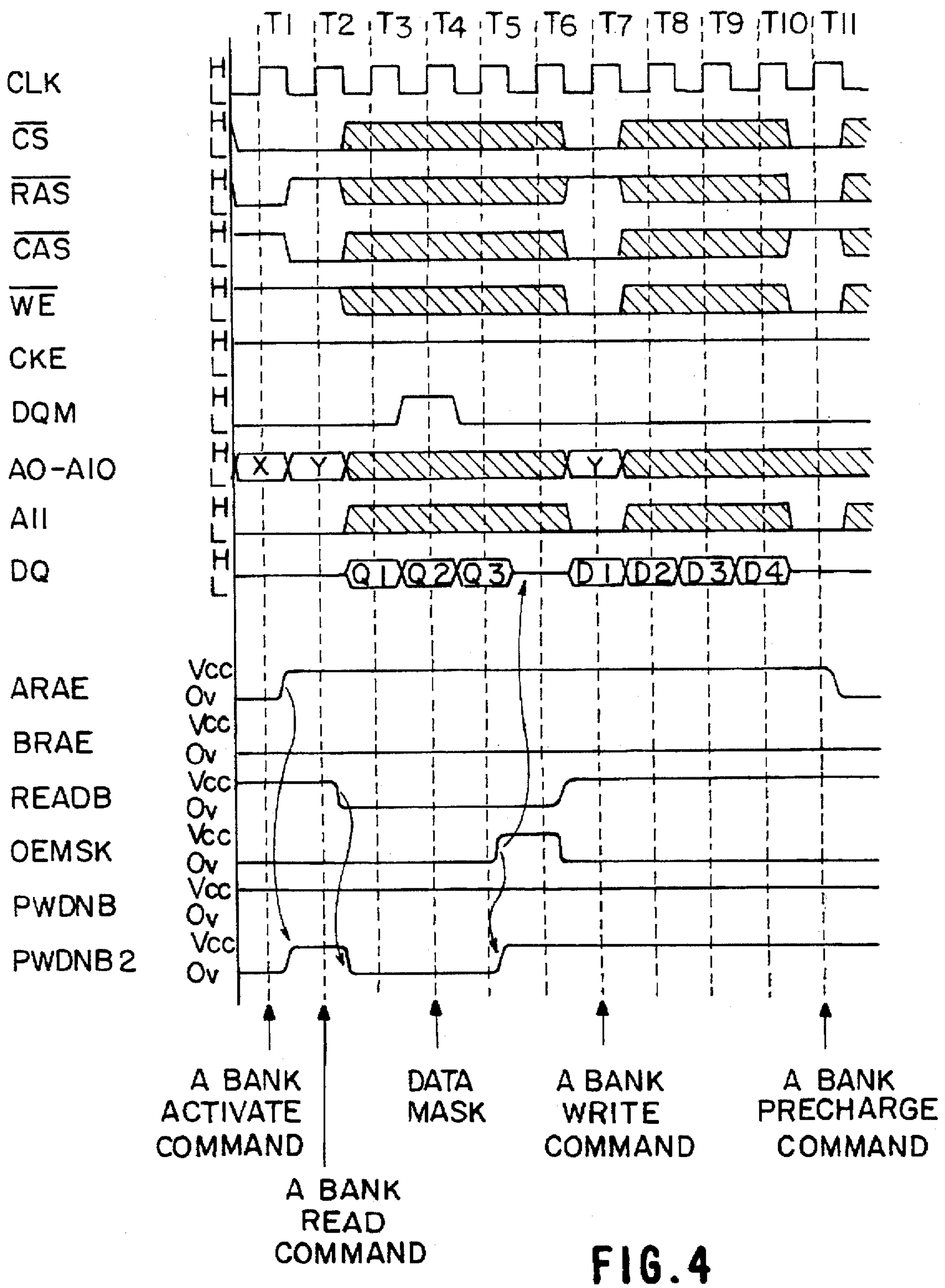
FIG. 4 is a timing chart for explaining the inputting of a disabling signal for the power reducing circuit shown in FIG. 2.

In the timing chart shown in FIG. 4, read activate signal READB remains at low level from a part of T2 cycle to a part of T6 cycle, and it cannot be used for turning power ON/OFF. Therefore, in this invention, the logic circuit is arranged so that, first, the external disabling signal (pin) DMQ becomes high during the readout period as shown in the timing chart, then the output masking signal OEMSK becomes high as illustrated by the relating arrow pointing to the absent Q4 and to the high level for the OEMSK signal. The result is to make the power-down signal command PWDNB2 high as illustrated by the relating arrow pointing to the high level for PWDNB2 signal, and thereby increasing the power to the initial input circuit. The power in the initial input circuit is accordingly made to be high during T5 cycle, for timely processing the input data DQ inputted into the initial input circuit in T6 cycle.

As explained above, in this invention, the circuit configuration allows the power to be reduced during the standby mode and/or readout mode, thus enabling to conserve power. Furthermore, the power can be restored to the synchronous semiconductor device by the provision of a disabling signal (pin) to nullify an output signal from the external input/output pin in the initial input circuit. By adopting such a circuit configuration, operational efficiency is improved and the error rate of the device is reduced.

The above embodiments are meant to be illustrative and not meant to be restrictive, and it is clear that other types of circuit and logic configurations can be devised within the concept of the power conservation approach illustrated.

What is claimed is:

1. A power conservation circuit in a semiconductor device comprising:

an input circuit which is supplied with an input signal, said input circuit is in an inactive-state when a power down signal is supplied;

a power down signal generating means for generating said power-down signal when said semiconductor device is in a standby mode and/or a readout mode, wherein said power down signal generating means includes a first OR circuit for receiving a vertical address strobe RAS enable signal AREA from an A bank, and a vertical address strobe RAS enable signal BRAE from a B bank;

a second OR circuit for receiving a read activate signal READB and an output masking signal OEMSK;

a NAND circuit for receiving an output signal from said first OR circuit, an output signal from said second OR circuit and a power-down mode signal PWDNB; and an inverter circuit for inverting an output signal from said NAND circuit, and supplying a power-down command signal PWDNB2 to an initial input circuit, thereby reducing the power supplied to said initial input circuit.

2. A semiconductor memory device comprising:

a plurality of memory cells;

an address circuit responding to address information and selecting at least one memory cell;

a data read/write circuit operating in a data-read mode to read a data from a selected memory cell to produce read-data and in a data-write mode to write write-data into a selected memory cell;

an input/output terminal;

an output buffer coupled between said data read/write circuit and said input/output terminal to transfer said read-data to said input/output terminal;

a power down signal generating means for generating a power down signal when said semiconductor memory device is in said data-read mode; and an input buffer coupled to said data read/write circuit and said input/output terminal to transfer data at said input/output terminal to said read/write circuit as said write-data, said input buffer being in an inactive-state when said power down signal is supplied to reduce a power consumed therein.

* * * * *